United States Patent [19]

Itoh

[11] Patent Number: 5,208,684
[45] Date of Patent: May 4, 1993

[54] HALF-TONE IMAGE PROCESSING SYSTEM

[75] Inventor: Seiichi Itoh, Kawasaki, Japan

[73] Assignee: Fujitsu Limited, Kawasaki, Japan

[21] Appl. No.: 690,574

[22] Filed: Apr. 24, 1991

[30] Foreign Application Priority Data

| Apr. 26, 1990 | [JP] | Japan | 2-111320 |
| May 21, 1990 | [JP] | Japan | 2-130701 |
| May 25, 1990 | [JP] | Japan | 2-133847 |
| May 25, 1990 | [JP] | Japan | 2-133851 |

[51] Int. Cl.$^5$ ............................................. G06K 9/34
[52] U.S. Cl. ........................................ 358/456; 382/41
[58] Field of Search .............. 382/56, 54, 22, 31, 382/41; 358/454-458

[56] References Cited

U.S. PATENT DOCUMENTS

| 4,654,722 | 3/1987 | Alkofer | 358/455 |
| 4,764,971 | 8/1988 | Sullivan | 382/41 |
| 4,797,942 | 1/1989 | Burt | 382/41 |
| 5,029,227 | 7/1991 | Kawamura | 382/54 |
| 5,109,430 | 4/1992 | Nishihara | 382/31 |
| 5,113,365 | 5/1992 | Yang | 358/213.26 |

OTHER PUBLICATIONS

Patent Abstracts of Japan, vol. 14, No. 26, (M-921) [3969] Jan. 18, 1990; & JP-A-1 264 846 (Fuji Xerox), Oct. 23, 1989.
Patent Abstracts of Japan, vol. 9, No. 214 (P-384) [1937], Aug. 31, 1985; & JP-A-60 74 091 (Fujitsu K.K.), Apr. 26, 1985.
Patent Abstracts of Japan, vol. 12, No. 417 (P-782) [3264], Nov. 7, 1988 & JP-A-63 155 273 (Fujitsu) Jun. 28, 1988.
Patent Abstracts of Japan, vol. 12, No. 494 (P-805) [3341], Dec. 23, 1988 & JP-A-63 204 375 (Fuji Xerox) Aug. 24, 1988.
Patent Abstracts of Japan, vol. 12, No. 111 (E-598) [2958], Apr. 8, 1988 & JP-A-62 239 666 (Seiko Epson), Oct. 20, 1987.

*Primary Examiner*—Stephen Brinich
*Attorney, Agent, or Firm*—Staas & Halsey

[57] ABSTRACT

A half-tone image processing system provides a density data storage unit for storing density data of each pixel of an original image. A Laplacian calculation unit, operatively connected to the density data storage unit, reads out density data from the density data storage unit. A Laplacian calculation is performed on an object pixel and on peripheral pixels around the object pixel to obtain corrected data. The Laplacian calculation is performed in such a manner that a difference in density between the object pixel and each of the peripheral pixels is calculated and all the differences are summed. A binary-coding unit operatively connected to the Laplacian calculation unit, compares the corrected data with a fixed threshold value to obtain binary-coded data indicating either black or white color in accordance with the threshold value. An error calculation unit, operatively connected to the Laplacian calculation unit and the binary-coding unit, determines a difference between the corrected data and the binary-coded data to obtain a binary-coded error therefrom. An error distribution unit, operatively connected to the error calculation unit, receives the binary-coded error and an error diffusion matrix to weight and diffuse the density data of each pixel and calculate a weighted binary-coded error of each pixel based on the corresponding coefficient. A calculation unit adds the weighted binary-coded error to the density data of each peripheral pixel and outputs the corrected density data to the density data storage unit to rewrite the original density data therein.

14 Claims, 11 Drawing Sheets

Fig. 8A

| 0 | -1 | 0 |
|---|----|---|
| -1 | +4 | -1 |
| 0 | -1 | 0 |

OBJECT PIXEL
COEFFICIENT

Fig. 8B

| -1 | 0 | -1 |
|----|---|----|
| 0 | +4 | 0 |
| -1 | 0 | -1 |

Fig. 8C

| 0 | 0 | -1 | 0 | 0 |
|---|---|----|---|---|
| 0 | -3 | -5 | -3 | 0 |
| -1 | -5 | +36 | -5 | -1 |
| 0 | -3 | -5 | -3 | 0 |
| 0 | 0 | -1 | 0 | 0 |

HALF-TONE IMAGE PROCESSING SYSTEM

BACKGROUND OF THE INVENTION

1. Field of the Invention

The present invention relates to an image processing system, more particularly, it relates a half-tone image processing system for obtaining a pseudo half-tone image. The present invention is advantageous for a digital image processing apparatus, such as a digital copy machine, an image scanner, a facsimile machine and the like.

2. Description of the Related Art

In general, an image is constituted by a plurality of pixels each of which is formed by density data consisting of a plurality of bits. The pseudo half-tone image is basically obtained by binary-coding the pixel in accordance with a predetermined method.

As is known, for example, a photograph includes many half-tone images. However, it is very difficult and troublesome to reproduce the half-tone image from the original photograph. Conventionally, there are two representative methods for reproducing a half-tone image, i.e., a "ordered dither" method and an error diffusion method.

There are, however, some problems in these methods as explained in detail hereinafter.

SUMMARY OF THE INVENTION

The object of the present invention is to provide a half-tone image processing system enabling high quality half-tone image reproduction of an original image.

In accordance with one aspect of the present invention, there is provided a half-tone image processing system including: a density data storage unit for storing density data of each pixel of an original image; a Laplacian calculation unit operatively connected to the density data storage unit for reading out density data from the density data storage unit, performing the Laplacian calculation for an object pixel and peripheral pixels around the object pixel of obtain corrected data, the Laplacian calculation being performed in such a manner that a difference between the density of the object pixel and the density of each peripheral pixel is calculated and all differences are summed; a binary-coding unit operatively connected to the Laplacian calculation unit for comparing the corrected data with a fixed threshold value, and obtaining binary-coded data indicating either black or white color in accordance with the threshold value; an error calculation unit operatively connected to the Laplacian calculation unit and the binary-coding unit for obtaining a difference between the corrected data and the binary-coded data, and outputting a binary-coded error therefrom; an error distribution unit operatively connected to the error calculation unit for receiving the binary-coded error and our error diffusion matrix for weighting and diffusing each density data, and a calculating a weighted binary-coded error of each pixel based on the corresponding error diffusion coefficient; and a calculation unit for adding the weighted binary-coded error to the density data of each peripheral pixel, and outputting the corrected density data to the density data storage unit to rewrite the original density data therein.

In the preferred embodiment, the corrected data from the Laplacian calculation unit is used as a variable threshold value at the binary-coding unit, the density data of the object pixel is input to the binary-coding unit to be compared with the variable threshold value so that the binary-coded data is obtained in accordance with the variable threshold value, and the binary-coded error is obtained as the difference between the density data and the binary-coded data in the error calculation unit.

In accordance with another aspect of the present invention, there is provided a half-tone image processing system including: a density data storage unit for storing density data of each pixel of an original image; a Laplacian calculation unit operatively connected to the density data storage unit for reading out the density data from the density data storage unit, performing the Laplacian calculation for an object pixel and peripheral pixels around the object pixel to obtain corrected data, the Laplacian calculation being performed in such a manner that a difference between the density of the object pixel and the density of each peripheral pixel is calculated and all differences are summed; an average error calculation unit for obtaining average correction data based on the binary-coded error and an error weighted matrix; an addition unit for adding the corrected data, the density data of the object pixel, and the average correction data, and outputting the resultant data therefrom; a binary-coding unit operatively connected to the addition unit for comparing the resultant data with a fixed threshold value, and obtaining binary-coded data indicating either black or white color in accordance with the threshold value; and an error calculation unit operatively connected to the addition unit and the binary-coding unit for obtaining a difference between the resultant data and the binary-coded data, and outputting a binary-coded error therefrom.

In the preferred embodiment, the corrected data from the Laplacian calculation unit is used as a variable threshold value at the binary-coding means, the binary-coded data is obtained in accordance with the variable threshold value, and the binary-coded error is obtained as the difference between the resultant data and the binary-coded data in the error calculation means.

BRIEF DESCRIPTION OF THE DRAWINGS

In the drawings:

FIGS. 8A to 8C are examples of Laplacian coefficient matrixes;

DESCRIPTION OF THE PREFERRED EMBODIMENTS

Before describing the preferred embodiments, an explanation will be given of conventional methods.

Figure 1:
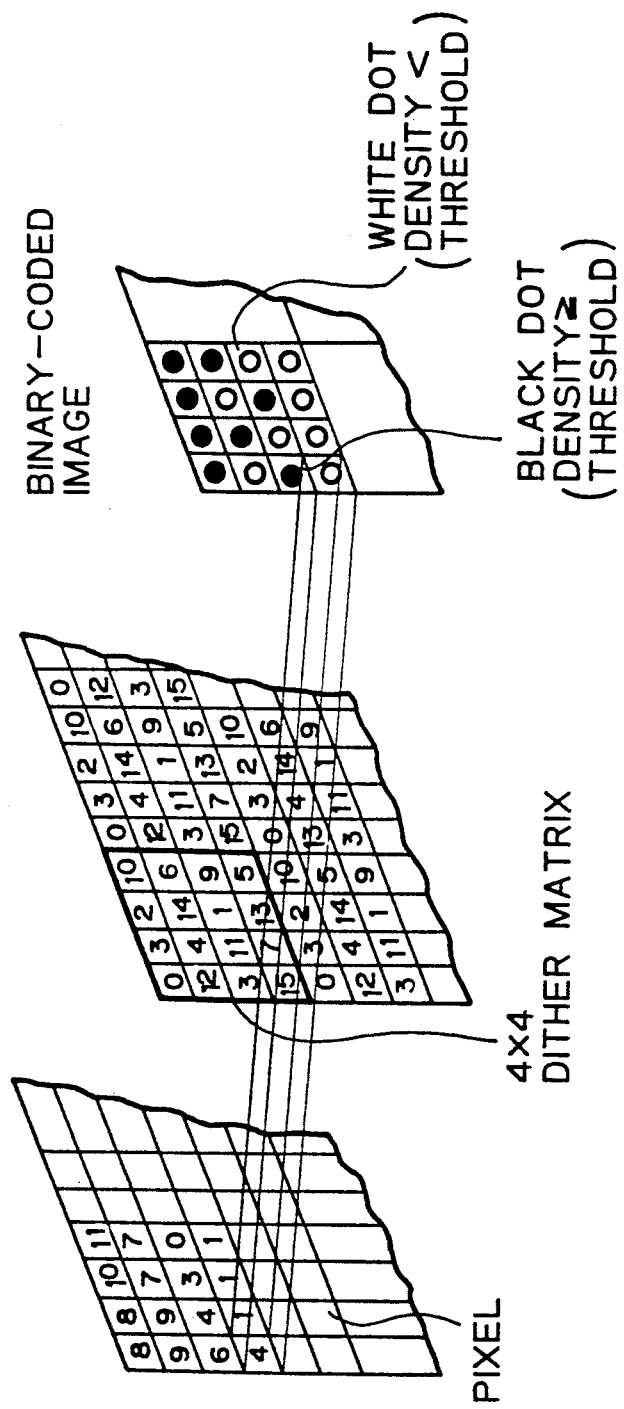
FIG. 1 is a view for explaining a conventional ordered dither method.

FIG. 1 is a view for explaining an ordered dither method. In FIG. 1, the left side denotes an original image, the center denotes a dither matrix having a threshold, and the right side denotes a binary-coded image.

In the original image, each square denotes one pixel, and a numeral in each square denotes the density of the pixel.

In the dither matrix, the matrix enclosed by a thick solid line denotes a 4×4 dither matrix. A numeral in each square denotes the threshold value of the density of each pixel. The 4×4 matrix is used as a general size of the dither matrix. As is obvious, all 4×4 dither matrixes have the same order of numerals as the matrix enclosed by the thick line. Although they are not shown, there are mainly three types of 4×4 dither matrices, i.e., a Bayer type, a meshed-point type and a spiral type. The difference among these types lies only in the order of numerals defining the threshold value.

As is obvious from the drawing, the binary-coded image is constituted by a plurality of black and white dots, and is obtained in such a manner that a black dot is defined when the density data of the pixel is equal to or larger than the threshold value, and a white dot is defined when the density data of the pixel is smaller than the threshold value.

There are, however, some problems in the ordered dither method as explained below.

First, some striped patterns (so called, "moire" pattern) periodically occur in the image. This striped pattern deteriorates the quality of the reproduced image, particularly, when the original image is a printed image consisting of the meshed-point. In general, the striped pattern may be caused by the periodicity of sequences (threshold values) of dither matrixes. This is because all 4×4 dither matrixes have the same sequence of numerals.

Second, when the original image contains characters and line drawings, parts of lines of the characters and line drawings are periodically cut-off so that the reproduced image becomes worse.

Third, the larger the matrix size is, the worse the resolution of the image is. That is, to obtain multi-gradation density, when the matrix size of the half-tone image processing system is set to larger size than general matrix size, it is difficult to achieve both the multi-gradation and high resolution since the resolution of the reproduced image becomes lower than the resolution of a scanner.

Figure 2:
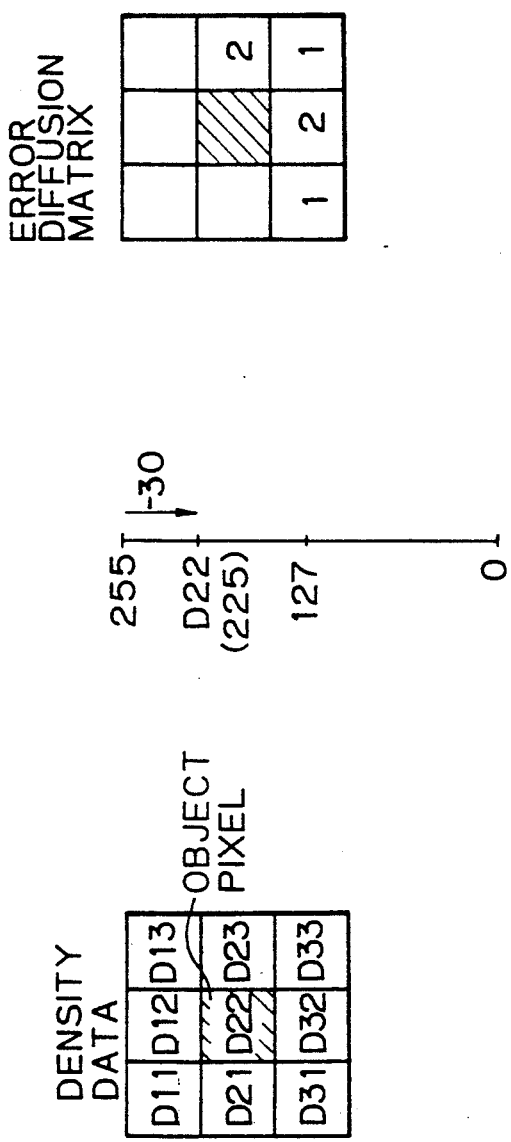
FIG. 2A to 2C are views for explaining a conventional error diffusion method.

FIGS. 2A to 2C are views for explaining an error diffusion method. The error diffusion method is well-known as a method enabling multi-gradation and high resolution. This method is disclosed, for example, in the publication "An Adaptive Algorithm for Spatial Grey Scale" by R.W. Floyd and L. Steinberg, 1975 SID International Symposium Digest of Technical Papers. 4.3. pp 36–37, April 1975.

In FIG. 2A, one square denotes one pixel, and D11 to D33 denote density data each having eight bits. The center pixel (slant line portion) having the density D22 is an object pixel. In FIG. 2B, since the density data is expressed by eight bits, 0 to 255 denote the density gradation of the pixel. The value 127 is a center value of the density gradation. Assuming that the density of the object pixel D22 has the value 225, the difference between the top value 255 and the value 225 is given as an error value −30.

In FIG. 2C, the binary-coding operation is performed by weighting the density data as explained below. That is, blank squares corresponding to the pixels D11 to D21, which are positioned before the center pixel, are the pixels for which the binary-coding operation has been completed. The pixels D23, D31, D32 and D33 positioned after the center pixel D22 have not yet been subjected to the binary-coding operation. Each of these pixels is weighted by corresponding numerals 2, 1, 2 and 1. In this case, the weighted value 2 is assigned to the nearest pixels D23 and D32, and the weighted value 1 is assigned to the other pixels D31 and D33. The error value −30 is a signed to the peripheral pixels as follows. The value 6 is a sum of all weighted values 2, 1, 2 and 1.

| | |
|---|---|
| D23: | −30 × 2/6 = −10 |
| D31: | −30 × 1/6 = −5 |
| D32: | −30 × 2/6 = −10 |
| D33: | −30 × 1/6 = −10 |

Accordingly, the new density values of the pixels D23 to D33 are assigned as follows.

| |
|---|
| D23' = D23 −10 |
| D31' = D31 −5 |
| D32' = D32 −10 |
| D33' = D33 −5 |

The new density values D23', D31', D32' and D33' are binary-coded by the threshold value, for example, the center density value 127.

As is obvious from the above explanation, the error diffusion method is more advantageous than the ordered dither method in that the striped pattern (moire pattern) does not occur in the reproduced image, and the multigradation and the resolution are improved.

There are, however, some problems in this error diffusion method as explained below.

First, in comparison with a simple binary-coded image, the quality of the reproduced image is not sufficiently close to the original image in the reproduction of characters or line drawings.

Second, in the low density gradation, since a dot is changed to a bit "1" after error values are gradually accumulated, a great deal of time is necessary for reproduction of the image dots.

Accordingly, the object of the present invention is to provide a half-tone image processing system enabling a high quality pseudo half-tone image.

Figure 3:
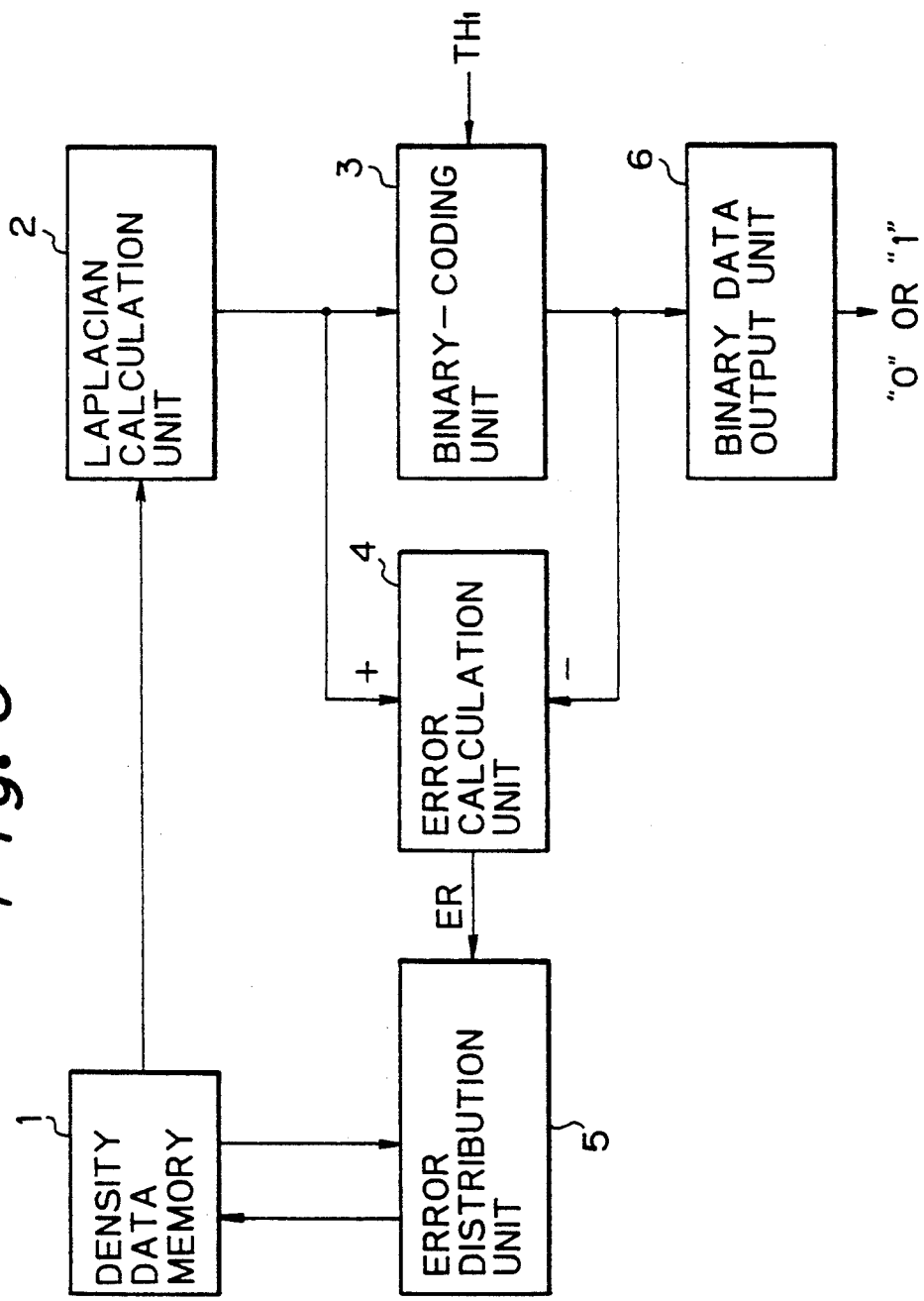
FIG. 3 is a schematic block diagram of a half-tone image processing system according to a first embodiment of the present invention.

FIG. 3 is a schematic block diagram of a half-tone image processing system according to a first embodiment of the present invention. In FIG. 3, reference number 1 denotes a density data memory, 2 a Laplacian calculation unit, 3 a binary-coding unit, 4 an error calculation unit, 5 an error distribution unit, and 6 a binary data output unit. Further, $TH_1$ denotes a threshold value for binary-coding. In the first embodiment, the threshold value $TH_1$ is defined as a fixed value.

In FIG. 3, the density data memory 1 stores the density data of each dot of the original image. In this case, the density data of each dot is constituted by a plurality of bits, for example, eight bits. The Laplacian calculation unit 2 performs a Laplacian calculation between the density data of the object pixel and the density data of the peripheral pixels around the object pixel to obtain corrected data. The Laplacian calculation is performed in such a manner that a difference between the density of the object pixel and the density of each peripheral pixel is obtained and all of the differences are summed. After the Laplacian calculation, the density data of the peripheral pixels are corrected by the error diffusion matrix for weighting and diffusing the original density data as explained in detail below.

The resultant data DA of the Laplacian calculation is applied to the binary-coding unit 3 and the error calculation unit 4, and compared with the threshold value $TH_1$. In the binary-coding unit 3, when the resultant data DA is equal to or larger than the threshold value $TH_1$, the binary-coding unit 3 outputs the bit "1". When the resultant data DA is smaller than the threshold value $TH_1$, binary-coding unit 3 outputs the bit "0".

The error calculation unit 4 calculates the binary-coded error ER between the resultant data DA and output of the binary-coding unit 3. In this case, when the output of the binary-coding unit 3 is the bit "1", the maximum value of the density data is input to the error calculation unit 4. When the output of the binary-coding unit 3 is the bit "0", the minimum value of the density data is input to the error calculation unit 4.

The error ER is output from the error calculation unit 4 to the error distribution unit 5. The error distribution unit 5 distributes the binary-coded error ER to density data of the peripheral pixel (the pixel to be processed) based on the error diffusion coefficient, and adds the distributed error value to the corresponding original pixel to revise the density data of the original pixel.

In this embodiment, since there is no boundary portion of the gradation in comparison with the ordered dither method, the profile of a character or line drawing is emphasized so that it is possible to achieve a high quality reproduced image.

Figure 4:
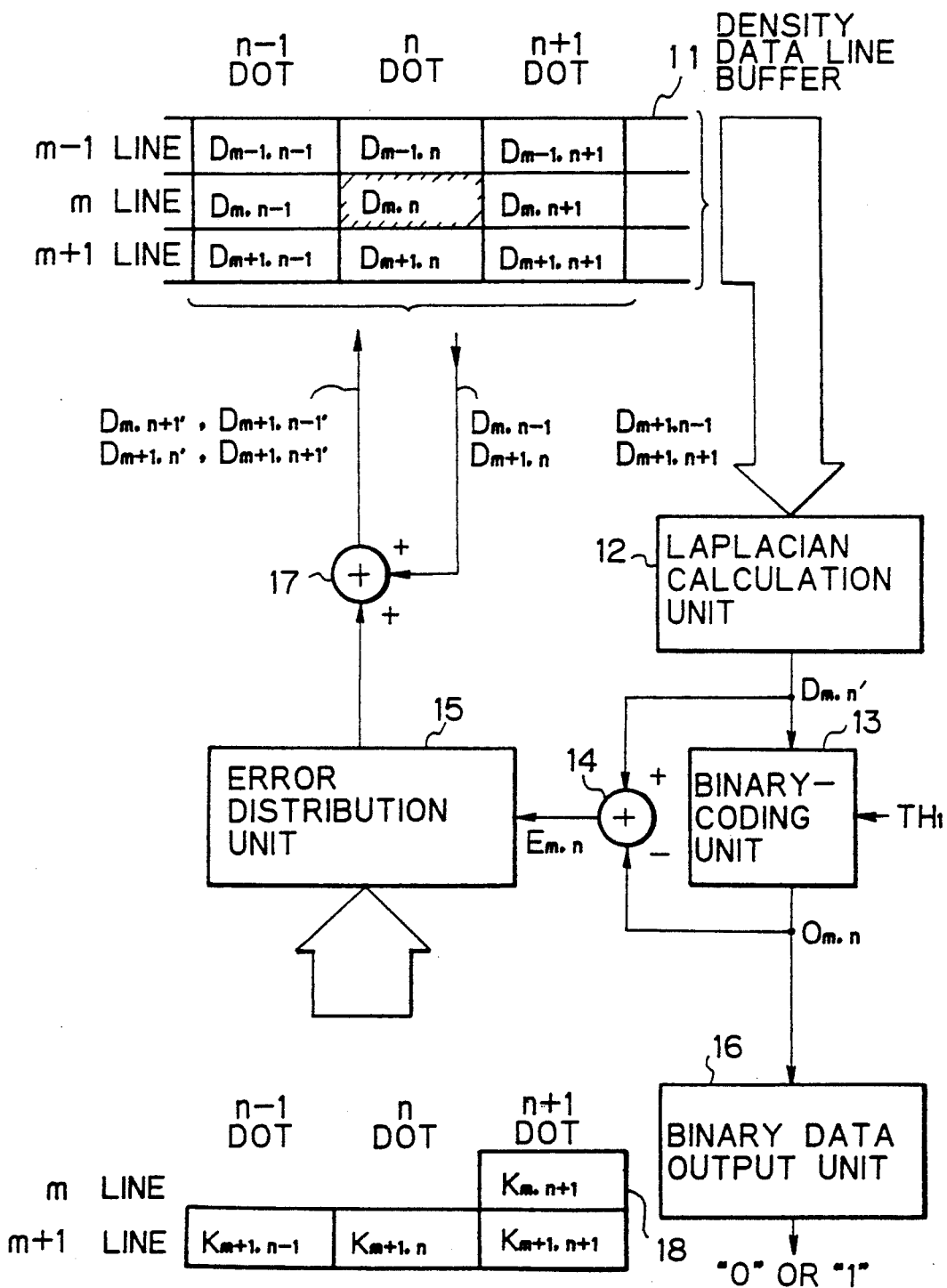
FIG. 4 is a block diagram of the half-tone image processing system shown in FIG. 3.
Figure 5:
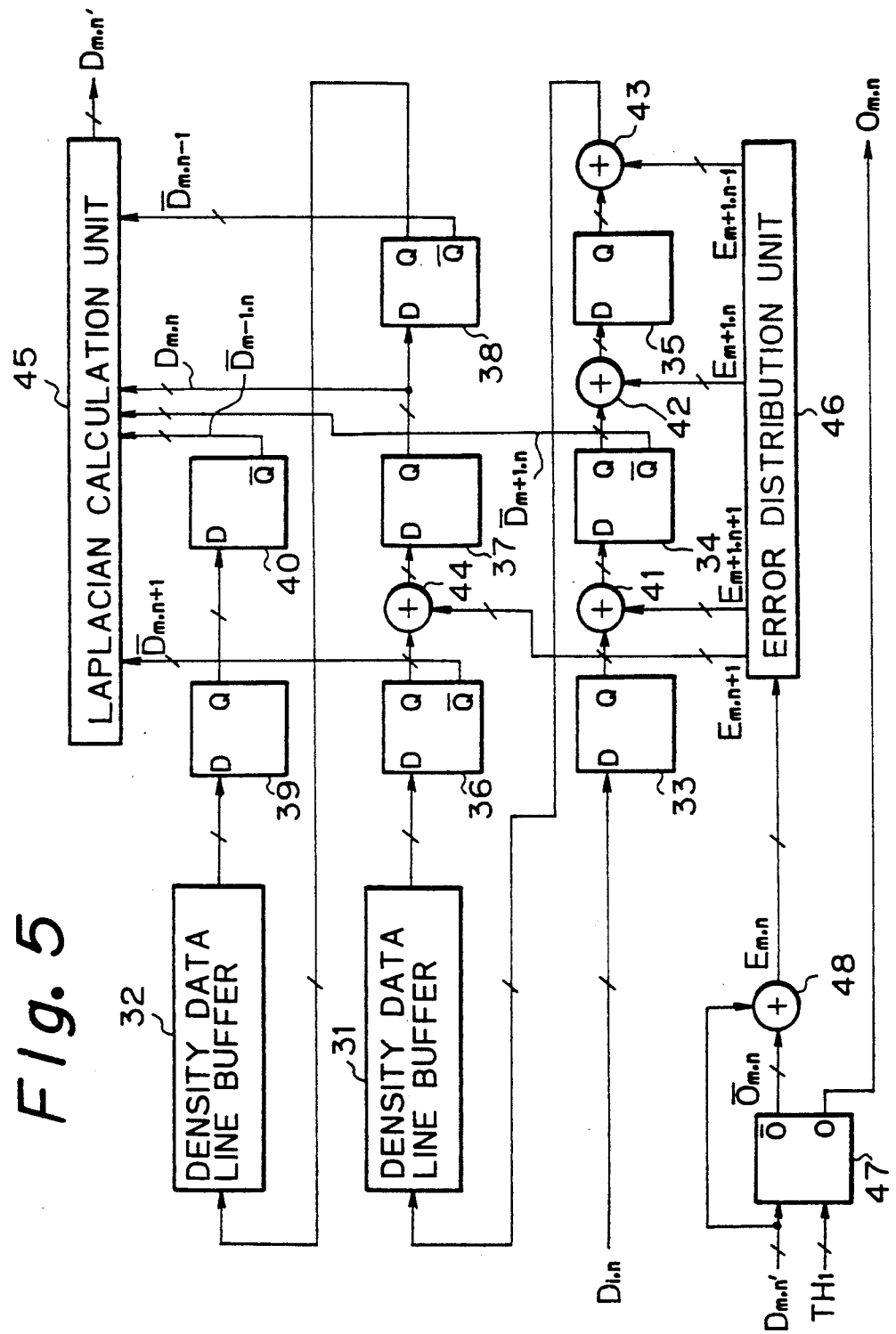
FIG. 5 is a partially detailed block diagram of the half-tone image processing system of FIG. 3.
Figure 6:
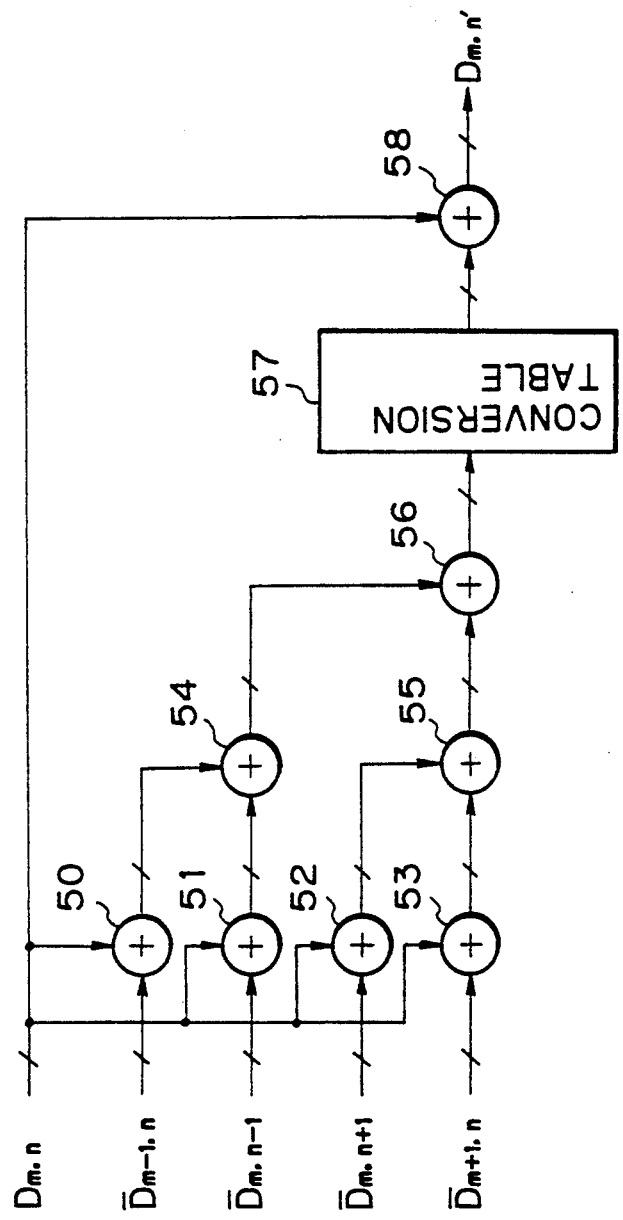
FIG. 6 is a detailed block diagram of the Laplacian calculation unit of FIG. 3.
Figure 7:
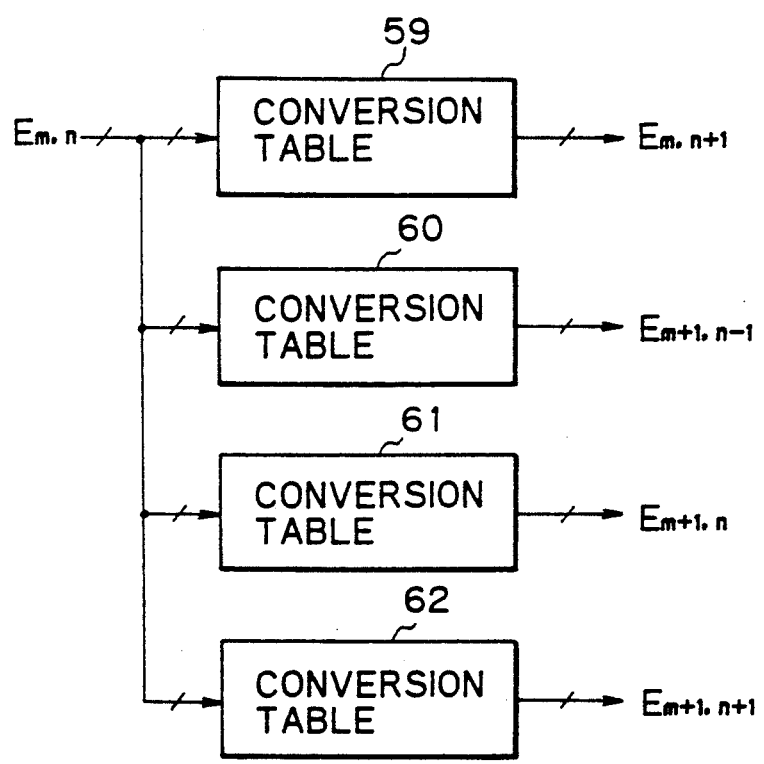
FIG. 7 is a detailed block diagram of the error distribution unit of FIG. 3.

FIG. 4 is a block diagram of the half-tone image processing system shown in FIG. 3, FIG. 5 is a partially detailed block diagram of the half-tone image processing system shown in FIG. 3, FIG. 6 is a detailed block diagram of the Laplacian calculation unit shown in FIG. 3, FIG. 7 is a detailed block diagram of the error distribution unit shown in FIG. 3, and FIGS. 8A to 8C are examples of Laplacian coefficient matrixes used in the Laplacian calculation of the binary-coded error.

In FIG. 4, reference number 11 denotes a density data line buffer (RAM) corresponding to the density data memory 1 in FIG. 3. Reference number 14 denotes an adder corresponding to the error calculation unit 4 in FIG. 3. Reference number 17 also denotes an adder included in the error distribution unit 5 in FIG. 3. Reference number 18 denotes an error diffusion matrix.

The original image is read out by a line-type image sensor (not shown) having N (integer) sensing elements for every line, and is digitized in accordance with the density data. As previously explained, the density data of each pixel is constituted by eight bits so that it is possible to express the density data of the pixel by 256 (integer) density gradations (from 0 to 255). That is, the minimum density is the integer 0, and the maximum density is the integer 255.

In the density data line buffer 11, $D_{m-1,n-1}$, $D_{m-1,n}$, --- $D_{m+1,n+1}$ represent the density data of each of the pixels. These pixels corresponds to the matrix shown in FIG. 8A, and the data $D_{m,n}$ represents the density data of the object pixel. The density data of the object and the peripheral pixels are input to the Laplacian calculation unit 12. The following calculation is performed in the Laplacian calculation unit 12.

$$D_{m,n}' = D_{m,n} + P((D_{m,n}-D_{m-1,n}) + (D_{m,n}-D_{m,n-1}) + (D_{m,n}-D_{m,n+1}) + (D_{m,n}-D_{m+1,n})) \quad (1)$$

Where, P is a positive value. As is obvious from the above formula, the Laplacian calculation is performed for the difference between the object pixel (m,n) and the peripheral pixels (m-1,n; m,n-1; m,n+1; m+1,n) around the object pixel.

Based on the resultant data ($D_{m,n}'$) of the above calculation, the density data of the object and peripheral pixels are corrected as explained below. The corrected data $D_{m,n}'$ is input to the binary-coding unit 13, and is compared with the threshold value $TH_1$.

In the binary-coding unit 13, when the corrected data $D_{m,n}'$ is larger than the threshold value $TH_1$, the binary-coded density data ($O_{m,n}$) of the object pixel (m,n) is expressed by the value 255 (black). When the corrected data $D_{m,n}'$ is equal to or smaller than the threshold value $TH_1$, the binary-coded density data ($O_{m,n}$) of the object pixel $D_{m,n}$ is expressed by the value 0 (white). The binary-coded data $O_{m,n}$ is than output from the binary-data output unit 16. That is, when the data $O_{m,n}$ is "255", the output value is the bit "1" (black), and when the data $O_{m,n}$ is "0", the output value is the bit "0" (white).

The binary-coded data $O_{m,n}$ is also output from the binary-coded unit 13 to the adder 14. In the adder 14, the binary-coded error $E_{m,n}$ is obtained as the difference between the corrected data $D_{m,n}'$ and the binary-coded data $O_{m,n}$ as shown by the following formula.

$$E_{m,n} = D_{m,n}' - O_{m,n} \quad (2)$$

This formula is the feature of the first embodiment. Further, the binary-coded error $E_{m,n}$ is input to the error distribution unit 15, is weighted by the error diffusion coefficient K, and is distributed to the peripheral pixels (m,n+1; m+1,n-1; m+1,,n; m+1,n+1) in accordance with the error diffusion matrix 18. Accordingly, the density data of the peripheral pixels (m,n+1: m+1,n-1; m+1,n; m+1,n+1) are corrected as follows.

$$D_{m,n+1}' = D_{m,n+1} + (K_{m,n+1}/\Sigma K_{i,j}) \times E_{m,n}$$

$$D_{m+1,n-1}' = D_{m+1,n-1} + (K_{m+1,n-1}/\Sigma K_{i,j}) \times E_{m,n}$$

$$D_{m+1,n}' = D_{m+1,n} + (K_{m+1,n}/\Sigma K_{i,j}) \times E_{m,n}$$

$$D_{m+1,n+1}' = D_{m+1,n+1} + (K_{m+1,n+1}/\Sigma K_{i,j}) \times E_{m,n}$$

Where,
$\Sigma K_{i,j} = K_{m,n+1} + K_{m+1,n-1} + K_{m+1,n} + K_{m+1,n+1}$

As is obvious from the above in the present invention, the binary-coded error $E_{m,n}$ is used for obtaining the corrected density data of the peripheral pixels.

FIG. 5 is a partially detailed block diagram of the half-tone image processing system of FIG. 3, FIG. 6 is a detailed block diagram of the Laplacian calculation unit of FIG. 3, and FIG. 7 is a detailed block diagram of the error distribution unit of FIG. 3.

In FIG. 5, reference numbers 31 and 32 denote density data line buffers corresponding to the density data line buffer 11 in FIG. 4, each density data line buffer is constituted by a RAM functioning as a FIFO (first-in first-out) buffer. Reference numbers 33 to 40 denote latch circuits for storing the data, 41 to 44 denote adders, 45 denotes a Laplacian calculation unit corresponding to the Laplacian calculation unit 12 in FIG. 4, 46 denotes an error distribution unit corresponding to the error distribution unit 15 in FIG. 4, 47 denotes binary-coding circuit, and 48 denotes an adder for error calculation. In FIG. 6, reference numbers 50 to 56, 58 denote adders, and reference number 57 denotes a conversion table. Further, in FIG. 7, reference numbers 59 to 62 denote conversion tables (for example, ROM).

The operation of the system is explained in detail below. In FIG. 5, density data $D_{i,n}$ of the pixel is input to the latch circuit 3, and sequentially transferred through the latch circuits 34 to 40, the adders 41 to 44 and the density data line buffers 31 and 32. Initially, in all latch circuits, the Q output is set to "O", and the inverted Q($\overline{Q}$) output is set to "1".

The density data $D_{m,n}$ of the latch circuit 37, i.e., the density data of the object pixel (m,n) is input to the Laplacian calculation unit 45. Further, the density data of the peripheral pixels, i.e., the density data $D_{m-1,n}$ of the latch circuit 40, the density data $D_{m,n+1}$ of the the latch circuit 38, the density data $D_{m,n+1}$ of the latch circuit 36, and the density data $D_{m+1,n}$ of the latch circuit 34 are also input to the Laplacian calculation unit 45.

The density data $D_{m,n}$ is added to each density data $D_{m-1,n}$, $D_{m,n-1}$, $D_{m,n+1}$ and $D_{m+1,n}$ by using each of the adders 50 to 56 as shown in FIG. 6. The resultant data of the adder 56 is input to the conversion table 57. The conversion table 57 previously stores the resultant data from multiplying the Laplacian coefficient by the density data. The adder 58 adds the density data $d_{m,n}$ of the object pixel (m,n) to the output of the conversion table 57 so that the adder 58 outputs the corrected density data $D_{m,n}'$.

The corrected density data $D_{m,n}'$ is input to the binary-coding circuit 47 as shown in FIG. 5, and is compared with the threshold value $TH_1$. The binary-coding circuit 47 outputs the binary data as follows.

When the corrected density data $D_{m,n}'$ is larger than the threshold value $TH_1$ in the inverted O output ($\overline{O}_{m,n}$), all eight bits are "O", and in the 0 output ($O_{m,n}$), the single bit is "1".

That is, the binary-coded output ($O_{m,n}$) is "1", and the density data becomes maximum (all eight bits are "1") so that all eight bits become "O" as the complement of the output "1".

When the corrected density data $D_{m,n}'$ is equal to or smaller than the threshold value $TH_1$, in the inverted O output ($\overline{O}_{m,n}$), all eight bits are "1", and in the O output ($O_{m,n}$), the single bit is "O".

That is, the binary-coded output ($O_{m,n}$) is "O", and the density data becomes maximum (all eight bits are "O") so that all eight bits become '1" as the complement of the output "O".

The binary-coding circuit 47 is constituted by, for example, a comparator and a NOT circuit (both not shown). The binary-coded error $E_{m,n}$ is obtained by the adder 48 is based on the density data $D_{m,n}$ and the inverted output $O_{m,n}$. The binary-coded error $E_{m,n}$ is input to the error distribution unit 46 as shown in FIG. 7. Each of the conversion tables 59 to 62 stores the error distribution value which is previously obtained from the weighted coefficient of the error diffusion matrix 18 shown in FIG. 4, and outputs the error distribution values ($E_{m,n+1}$, $E_{m+1,n-1}$, $E_{m+1,n}$, $E_{m+1,n+1}$). These error distribution values are input to the adders 41 to 44 as shown in FIG. 5.

As shown in FIG. 5, the adders 41 to 44 and the Q output of the latch circuits 33 to 36 ($D_{m,n+1}$, $D_{m+1,n-1}$, $D_{m+1,n}$, $D_{m+1,n+1}$) to the error distribution values ($E_{m,n+1}$, $E_{m+1, n-1}$, $E_{m+1,n}$, $E_{m+1, n+1}$), respectively.

FIGS. 8A to 8C are examples of Laplacian coefficient matrixes used in the Laplacian calculation of the binary-coded error. In FIGS. 8A to 8C, each number denotes a Laplacian coefficient for weighting the density data as previously explained. In these drawings, the center pixel denotes an object pixel to be weighted. In case of the Laplacian matrix shown in FIG. 8C, many peripheral pixels are provided around the object pixel (+36), but the Laplacian calculation is the same as shown in FIG. 8A.

Figure 9:
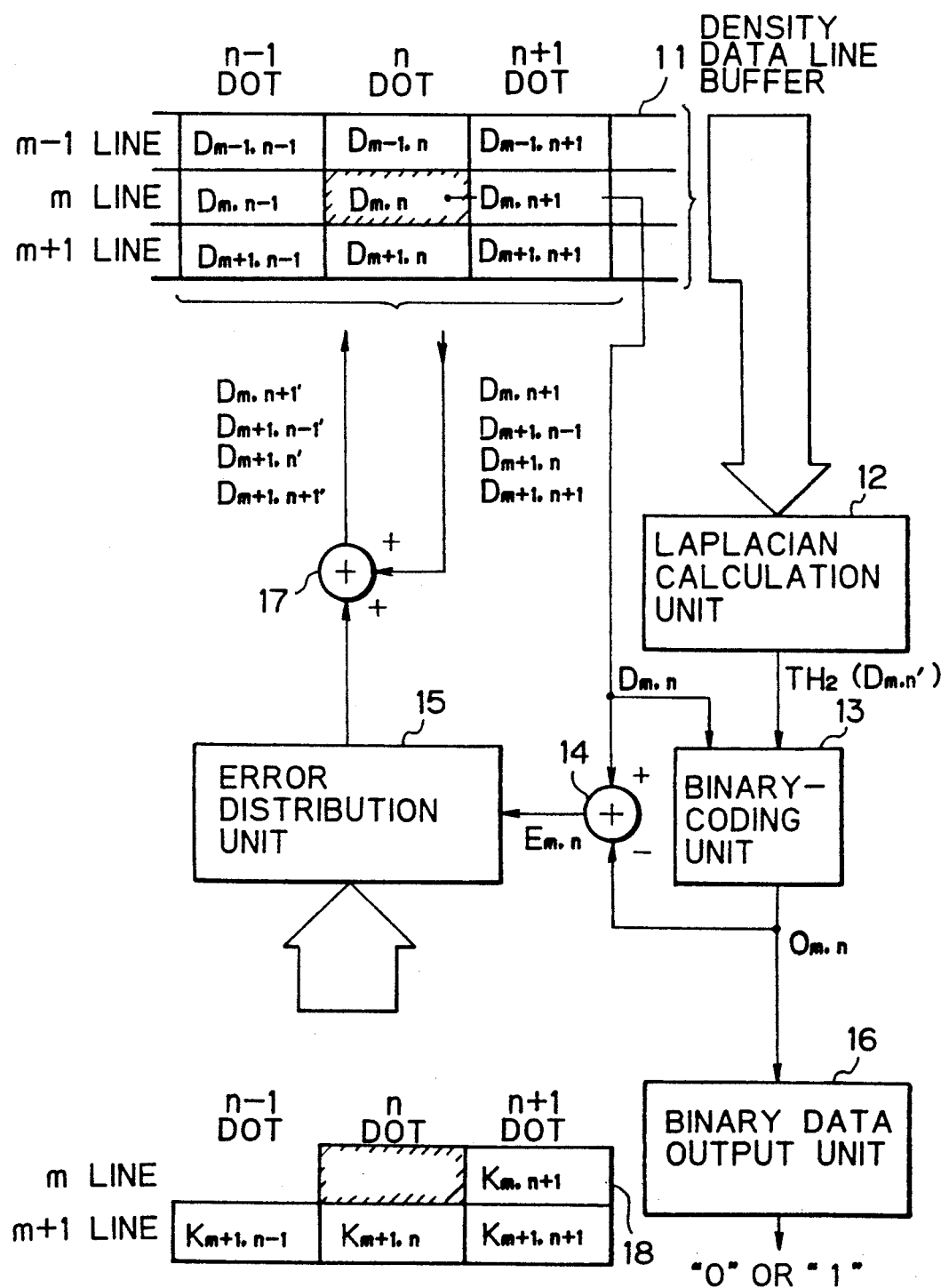
FIG. 9 is a schematic block diagram of half-tone image processing system according to a second embodiment of the present invention.

FIG. 9 is a schematic block diagram of a half-tone image processing system according to a second embodiment of the present invention. In FIG. 9, the same reference numbers as used in FIG. 4 are attached to the same components in this drawing. As is obvious from the drawing, the structure of this embodiment is the same structure as the first embodiment shown in FIG. 4. In this embodiment, the density data $D_{m,n}$ of the object pixel (m,n) is input to the binary-coding unit 13 and the adder 14. Further, the resultant data of the Laplacian calculation is used as the threshold value $TH_2$. Accordingly, threshold value $TH_2$ is variable in this embodiment.

In the binary-coding unit 13, the density data $D_{m,n}$ of the object pixel (m,n) is compared with the threshold value $TH_2$. That is, when the density data $D_{m,n}$ is larger than the threshold value $TH_2$, the binary-coded density data $O_{m,n}$ is expressed by the value 255 (black). When the density data $D_{m,n}$ is equal to or smaller than the threshold value $TH_2$, the binary-coded density data $O_{m,n}$ is expressed by the value 0 (white). The binary-coded density data $O_{m,n}$ is output to the binary-data output unit 16. That is, when the data $O_{m,n}$ is "255", the output value from the binary-data output unit 16 is "1" (black), and when the data $O_{m,n}$ is "O", the output value is "O" (white).

The binary-coded data $O_{m,n}$ is also output from the binary-coding unit 13 to the adder 14. In the adder 14, the binary-coded error $E_{m.n}$ is obtained as the difference between the density data $D_{m,n}$ and the binary-coded data $O_{m,n}$ as shown by the following formula.

$$E_{m.n} = D_{m,n} - O_{m,n} \qquad (3)$$

The binary-coded error $E_{m.n}$ is input to the error distribution unit 15. The subsequent explanations are omitted since, after this stage, the calculations are the same as those of the first embodiment shown in FIG. 4.

Figure 10:
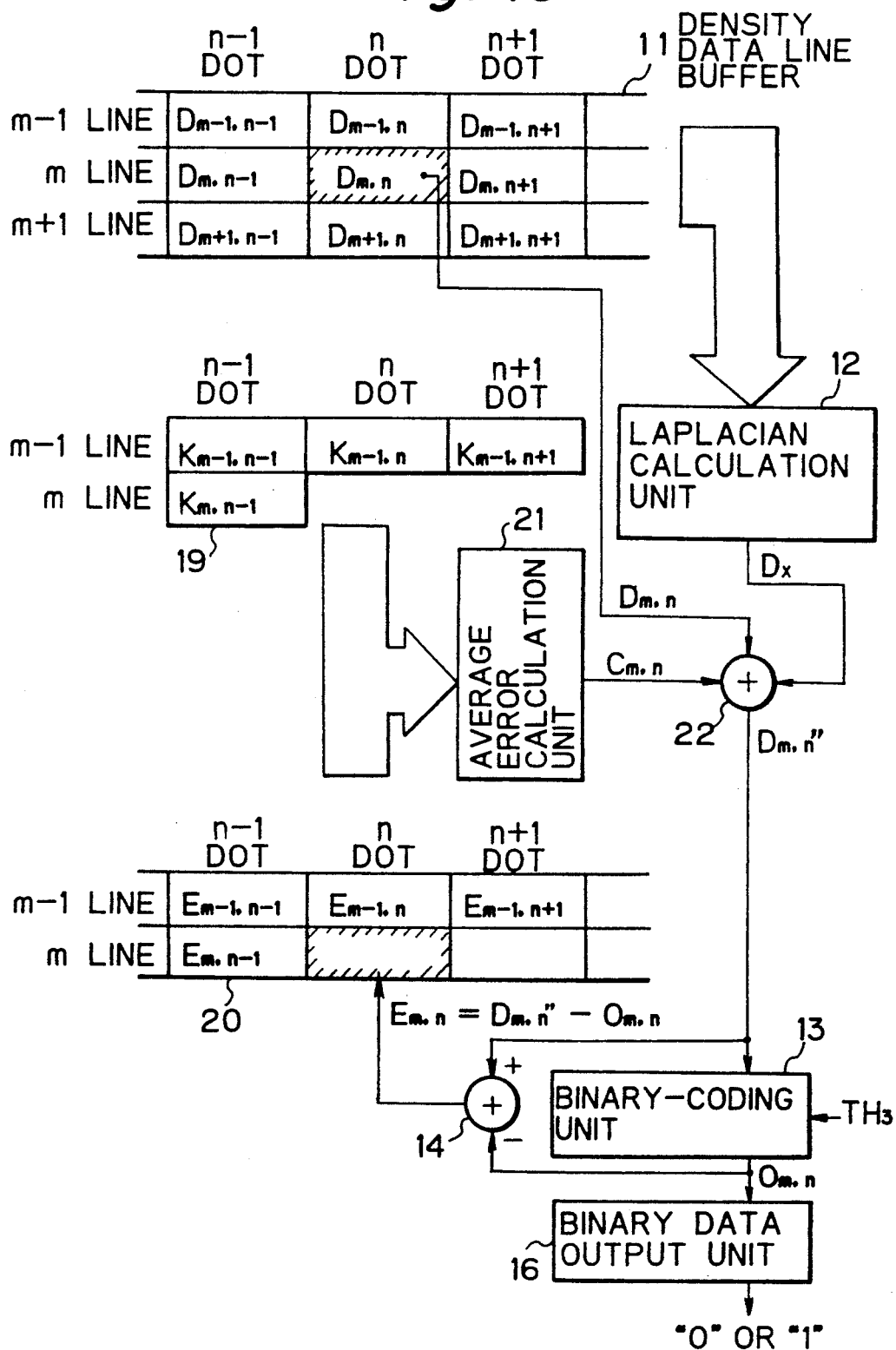
FIG. 10 is a schematic block diagram of half-tone image processing system according to a third embodiment of the present invention.

FIG. 10 is a schematic block diagram of a half-tone image processing system according to a third embodiment of the present invention. In FIG. 10, the same reference numbers as used in FIG. 4 are attached to the same components in this drawing. Reference number 19 denotes an error weighted matrix, 20 an error data line memory, 21 an average error calculation unit, and 22 an adder.

As shown in the drawing, the density data $D_{m,n}$ of the object pixel (m,n) is input to the adder 22, and the resultant data $D_{m,n}'$ of the Laplacian calculation is also input to the adder 22. In this case, the resultant data $D_x$ is obtained from the formula (1). That is, the data $D_x$ is given by $P((D_{m,n}-D_{m-1,n})+\cdots+(D_{m,n}-D_{m+1,n}))$. Further, a weighted average value (i.e., correction value) $C_{m,n}$ is input from the average error calculation unit 21 to the adder 22. The correction value $C_{m,n}$ is obtained by the following calculation in the average error calculation unit 21. That is, $$C_{m,n} = \frac{((K_{m-1,n-1} \times E_{m-1,n-1}) + (K_{m-1,n} \times E_{m-1,n}) + (K_{m-1,n+1} \times E_{m-1,n+1}) + (K_{m,n-1} \times E_{m,n-1}))}{(K_{m-1,n-1} + K_{m-1,n} + K_{m-1,n+1} + K_{m,n-1})} \quad (4)$$

The density data $D_{m,n}$, the resultant data $D_x$, and the correction value $C_{m,n}$ are added to each other in the adder 22, and the adder 22 outputs the resultant data $D_{m,n}''$ to the binary-coding unit 13 and the adder 14. In the binary-coding unit 13, the resultant data $D_{m,n}''$ is 22, and the adder 22 outputs the resultant data $D_{m,n}''$ to the binary-coding unit 13 and the adder 14. In the binary-coding unit 13, the resultant data $D_{m,n}''$ is compared with a threshold value $TH_3$. The threshold value $TH_3$ is defined as a fixed value.

When the resultant data $D_{m,n}''$ is larger than the threshold value $TH_3$, the binary-coded density data $O_{m,n}$ is expressed by the value 255 (black). When the resultant data $D_{m,n}''$ is equal to or smaller than the threshold value $TH_3$, the binary-coded density data $O_{m,n}$ is expressed by the value 0 (white). The binary-coded data $O_{m,n}$ is output to the binary-data output unit 16. That is, when the data $O_{m,n}$ is "255", the output value from the binary-data data output unit 16 is "1" (black), and when the data $O_{m,n}$ is "0", the output value is "0" (white).

The binary-coded data $O_{m,n}$ is also input from the binary-coding unit 13 to the adder 14. In the adder 14, the binary-coded error $E_{m,n}$ is obtained as the difference between the resultant data $D_{m,n}''$ and the binary-coded data $O_{m,n}$ as shown by the following formula.

$$E_{m,n} = D_{m,n}'' - O_{m,n} \quad (5)$$

Accordingly, the binary-coded error $E_{m,n}$ of the formula (5) is input to the error data line buffer that the correction value $C_{m,n}$ can be obtained from the formula (4) in the average error calculation unit 21 as explained above.

Figure 11:
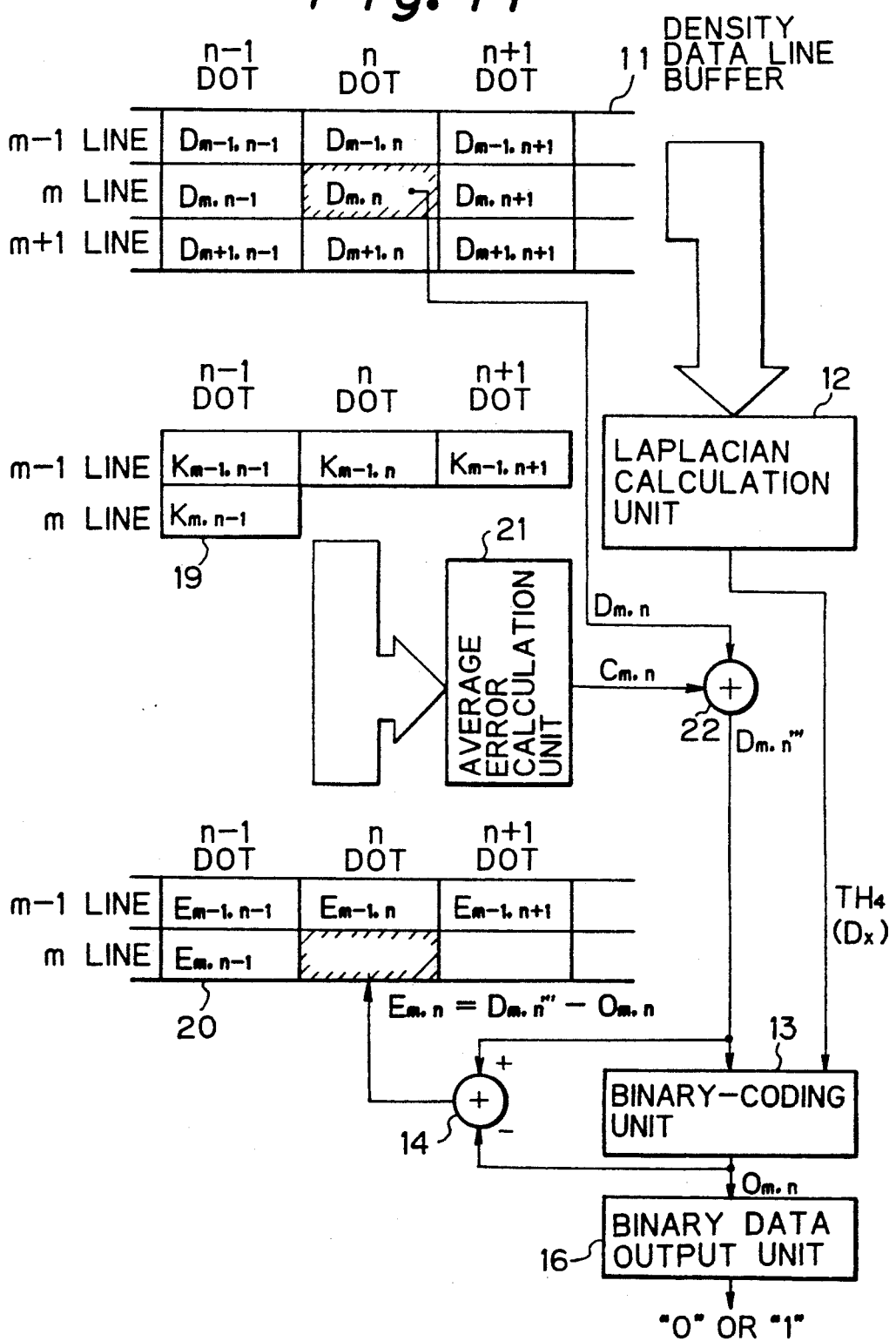
FIG. 11 is a schematic block diagram of half-tone image processing system according to a fourth embodiment of the present invention.

FIG. 11 is a schematic block diagram of a half-tone image processing system according to a fourth embodiment of the present invention. In FIG. 11, the same reference numbers as used in FIG. 10 are attached to the same components in this drawing. As is obvious from the drawing, the structure of this embodiment is the same structure as the third embodiment shown in FIG. 10. In this embodiment, the density data $D_{m,n}$ of the object pixel (m,n) is input to the adder 22. Further, the resultant data $D_x$ of the Laplacian calculation is used as the threshold value $TH_4$. Accordingly, threshold value $TH_4$ is variable in this embodiment.

As is obvious from the drawing, the density data $D_{m,n}$ of the noted pixel (m,n) and the correction value $C_{m,n}$ are input to the adder 22, and the adder 22 outputs the resultant data $D_{m,n}'''$ to the binary-coding unit 13. Since the binary-coded data $O_{m,n}$ from the binary-coding unit 13 is obtained in the same manner as explained in FIG. 10, the explanation is omitted in this embodiment. The binary-coded data $O_{m,n}$ is also input from the binary-coding unit 13 to the adder 14. In the adder 14, the binary-coded error $E_{m,n}$ is obtained as the difference between the resultant data $D_{m,n}'''$ and the binary-coded data $O_{m,n}$ as shown by the following formula.

$$E_{m,n} = D_{m,n}''' - O_{m,n} \quad (6)$$

Accordingly, the binary-coded error $E_{m,n}$ of the formula (6) is input to the error data line buffer 20 so that the correction value $C_{m,n}$ can be obtained from the formula (4) in the average error calculation unit 21 as explained above.

I claim:

1. A half-tone image processing system, comprising:
density data storage means for storing density data of each pixel of an original image;
Laplacian calculation means for reading out the density data from the density data storage means, for performing a Laplacian calculation on an object pixel and peripheral pixels around the object pixel to obtain corrected data, the Laplacian calculation being performed in such a manner that a difference in density between the object pixel and each of the peripheral pixels is calculated and all the differences are summed;
binary-coding means for comparing the corrected data with a fixed threshold value to obtain binary-coded data indicating either black or white color in accordance with the threshold value;
error calculation means for determining a difference between the corrected data;
an error distribution means for receiving the binary-coded error and a predetermined error diffusion matrix and for obtaining a weighted binary-coded error for each peripheral pixel based on the received binary-coded error and the predetermined error diffusion matrix; and
calculation means for adding the weighted binary-coded error to the density data corresponding to each peripheral pixel to produce corrected density data, and for replacing the density data with the corrected density data int he density data storage means.

2. A half-tone image processing system, comprising:
density data storage means for storing density data of each pixel of an original image;
Laplacian calculation means for reading out the density data from the density data storage means, for performing a Laplacian calculation on an object pixel and peripheral pixels around the object pixel to obtain corrected data, the Laplacian calculation being performed in such a manner that a difference in density between the object pixel and each of the peripheral pixels is calculated and all the differences are summed;
average error calculation means for receiving a binary-coded error and an error weighted matrix and for obtaining average correction data based on the binary coded error and the error weighted matrix;
addition means for adding the corrected data of the object pixel, and the average correction data to output resultant data;

binary-coding means for comparing the resultant data with a fixed threshold value to obtain binary-coded data indicating either black or white color in accordance with the fixed threshold value; and error calculation means for obtaining a difference between the resultant data and the binary-coded data to output binary-coded error.

3. A half-tone image processing system, comprising:

density data storage means for storing density data of each pixel of an original image;

Laplacian calculation means for reading out the density data from the density data storage means, for performing a Laplacian calculation on an object pixel and peripheral pixels around the object pixel to obtain corrected data, the Laplacian calculation being performed in such a manner that a difference in density between the object pixel and each of the peripheral pixels is calculated and all the differences are summed;

binary-coding means for comparing the corrected data and the density data of the object pixel to obtain binary-coded data indicating either block or white color in accordance with the density data of the object pixel;

error calculation means for determining a difference between the density data and the binary-coded data to obtain a binary-coded error;

an error distribution means for receiving the binary-coded error and a predetermined error diffusion matrix and for obtaining a weighted binary-coded error for each peripheral pixel based on the received binary-coded error and the predetermined error diffusion matrix; and calculation means for adding the weighted binary-coded error to the density data corresponding to each peripheral pixel to produce corrected density data, and for replacing the density data in the density data storage means.

4. A half-tone image processing system, comprising:

density data storage means for storing density data of each pixel of an original image;

Laplacian calculation means for reading out the density data from the density data storage means, for performing a Laplacian calculation on an object pixel and peripheral pixels around the object pixel to obtain corrected data, the Laplacian calculation being performed in such a manner that a difference in density between the object pixel and each of the peripheral pixels is calculated and all the differences are summed;

average error calculation means for receiving a binary-coded error and an error weighted matrix, and for obtaining average correction data based on the binary coded error and the error weighted matrix;

addition means for adding the density data of the object pixel and the average correction data to output resultant data;

binary-coding means for comparing the resultant data and the corrected data to obtain binary-coded data indicating either black or white color in accordance with the corrected data; and error calculation means for obtaining a difference between the resultant data and the binary-coded data to output a binary-coded error.

5. A half-tone image processing system for processing an image made of pixels having density data wherein one of the pixels is an object pixel and pixels around the object pixel are peripheral pixels, comprising:

Laplacian calculation means for determining differences in density between the object pixel and each of the peripheral pixels and for summing the differences to obtain corrected data;

binary-coding means for thresholding based on at least the corrected data to obtain binary-coded data; and error calculation means for determining a difference based on at least the binary coded data to obtain a binary-coded error.

6. A system according to claim 5, wherein said error calculation means comprises means for determining a difference between the corrected data and the binary-coded data to obtain the binary-coded error.

7. A system according to claim 6, wherein said binary-coding means comprises means for comparing the corrected data and a fixed threshold value to obtain the corrected data.

8. A system according to claim 7, further comprising:

error distribution means for receiving the binary-coded error and a predetermined error diffusion matrix and for obtaining a weighted binary-coded error for each peripheral pixel based on the received binary coded error and the predetermined error diffusion matrix; and calculation means for adding the weighted binary-coded error to the density data corresponding to each peripheral pixel to produce corrected density data, and for replacing the corrected density data in the density data storage means.

9. A system according to claim 5, wherein said error calculation means comprises means for determining a difference between the density data and the binary-coded data to obtain the binary-coded error.

10. A system according to claim 9, wherein said binary-coding means comprises means for comparing the corrected data and the density data of the object pixel to obtain the corrected data.

11. A system according to claim 10, further comprising:

error distribution means for receiving the binary-coded error and a predetermined error diffusion matrix and for obtaining a weighted binary-coded error for each peripheral pixel based on the received binary coded error and the predetermined error diffusion matrix; and calculation means for adding the weighted binary-coded error to the density data corresponding to each peripheral pixel to produce corrected density data, and for replacing the corrected density data in the density data storage means.

12. A system according to claim 5,
wherein said system further comprises:

average error calculation means for receiving a binary-coded erorr and an error weighted matrix and for obtaining average correction data based on the binary coded error and the error weighted matrix; and addition means for adding at least the density data of the object pixel and the average correction data to output resultant data; and wherein said error calculation means comprises means for determining a difference between the resultant data and the binary coded data to obtain the binary-coded error.

13. A system according to claim 12, wherein said binary-coding means comprises means for comparing the resultant data and a fixed threshold to obtain the binary-coded data.

14. A system according to claim 12, wherein said binary-coding means comprises means for comparing the resultant data and the corrected data to obtain the binary-coded data.

* * * * *

UNITED STATES PATENT AND TRADEMARK OFFICE
CERTIFICATE OF CORRECTION

PATENT NO. : 5,208,684
DATED : May 4, 1993
INVENTOR(S) : Seiichi ITOH

It is certified that error appears in the above-indentified patent and that said Letters Patent is hereby corrected as shown below:

On the Front Page, in block [57], in the Abstract, line 12, after "unit" insert --,--.

Col. 7, line 32, "$D_{m,n+1}$" should be --$D_{m,n-1}$--;
line 43, "$d_{m,n}$" should be --$D_{m,n}$--.

Col. 9, line 38, delete "data" (second occurrence);
line 50, after "buffer" insert --20 so--.

Col. 10, line 48, "int he" should be --in the--.

Col. 11, line 21, "block" should be --black--.

Col. 12, line 50, "erorr" should be --error--.

Signed and Sealed this

Twenty-ninth Day of March, 1994

Attest:

BRUCE LEHMAN

*Attesting Officer*      *Commissioner of Patents and Trademarks*